US012708019B2

(12) United States Patent
Chaji

(10) Patent No.: US 12,708,019 B2
(45) Date of Patent: Aug. 11, 2026

(54) PASSING SIGNALS THROUGH MICRO DEVICE SIDEWALLS

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 804 days.

(21) Appl. No.: 17/919,645

(22) PCT Filed: May 11, 2021

(86) PCT No.: PCT/CA2021/050654
§ 371 (c)(1),
(2) Date: Oct. 18, 2022

(87) PCT Pub. No.: WO2021/226714
PCT Pub. Date: Nov. 18, 2021

(65) Prior Publication Data

US 2023/0170317 A1 Jun. 1, 2023

Related U.S. Application Data

(60) Provisional application No. 63/022,671, filed on May 11, 2020.

(51) Int. Cl.
*H10W 72/90* (2026.01)
*H10W 70/60* (2026.01)
*H10W 70/65* (2026.01)
*H10W 70/654* (2026.01)

(52) U.S. Cl.
CPC ............ *H10W 72/90* (2026.01); *H10W 70/60* (2026.01); *H10W 70/65* (2026.01); *H10W 70/654* (2026.01); *H10W 72/923* (2026.01); *H10W 72/932* (2026.01); *H10W 72/934* (2026.01); *H10W 72/942* (2026.01)

(58) Field of Classification Search
CPC ........... H01L 2224/02371; H01L 2224/05548; H10W 70/65–654; H10W 72/922
See application file for complete search history.

(56) References Cited

U.S. PATENT DOCUMENTS

| | | | |
|---|---|---|---|
| 8,206,995 B2 | 6/2012 | Reyes et al. | |
| 9,142,453 B1 | 9/2015 | Chiu et al. | |
| 2008/0258306 A1* | 10/2008 | Chang | H01L 24/18 257/762 |
| 2010/0079924 A1 | 4/2010 | Keating et al. | |
| 2014/0374742 A1* | 12/2014 | Tsang | H01L 25/167 257/43 |
| 2015/0145103 A1 | 5/2015 | Chou et al. | |
| 2017/0186907 A1 | 6/2017 | Chaji et al. | |

(Continued)

OTHER PUBLICATIONS

ROC (Taiwan): TW Office Action relating to TW application No. 110116962, dated Jan. 8, 2025.

(Continued)

*Primary Examiner* — Amar Movva

(57) ABSTRACT

The present invention relates to structure and formation of side walls in micro devices. The structure allows access of one side of the micro device to another side through conductive layers and pads. In particular, the top and bottom sides of the micro devices are in direction of the current in the device and sidewalls are isolation surfaces surrounding the top and bottom sides of the device.

24 Claims, 6 Drawing Sheets

(56) References Cited

U.S. PATENT DOCUMENTS

| | | | |
|---|---|---|---|
| 2018/0287027 | A1 | 10/2018 | Chaji |
| 2019/0148501 | A1 | 5/2019 | Chen et al. |
| 2019/0288156 | A1 | 9/2019 | Chaji et al. |

OTHER PUBLICATIONS

WIPO: PCT International Search Report and Written Opinion relating to PCT application No. PCT/CA2021/050654, dated Aug. 9, 2021.

* cited by examiner

Top View

Bottom View

PASSING SIGNALS THROUGH MICRO DEVICE SIDEWALLS

BACKGROUND AND FIELD OF THE INVENTION

The present invention relates to formation of side walls in micro devices.

SUMMARY

This invention relates to a micro device structure comprising, stacked layers comprising functional active, doped and blocking layers, a conductive layer deposited on a sidewall, the sidewall covered by a dielectric layer, the conductive layer coupling a contact from a top to a bottom of the micro device, and the conductive layer coupled to the device at least through one point. In an additional embodiment the conductive layer may cover at least part of the sidewall and may be extended over the dielectric layer at least in one area.

According to another embodiment, the invention discloses a method to pass a signal through a side wall of a micro device, the method comprising, having stacked layers comprising functional active, doped and blocking layers, depositing a first conductive layer on the sidewall, covering the sidewall covered by a dielectric layer, coupling a contact from a top to a bottom of the micro device though the first conductive layer; coupling the first conductive layer to the micro device at least through one point, and injecting the signal though the top and bottom of the micro device.

BRIEF DESCRIPTION OF THE DRAWINGS

The foregoing and other advantages of the disclosure will become apparent upon reading the following detailed description and upon reference to the drawings.

Figure 1:
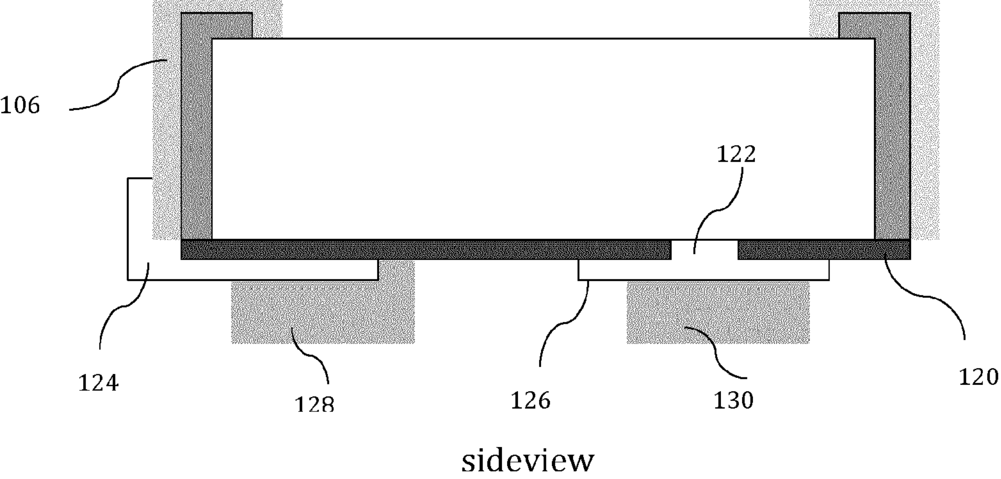
FIG. 1. shows a side view of the micro device structure with a VIA and pads.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the terms “device” and “micro device” are used interchangeably. However, it is clear to one skilled in the art that the embodiments described here are independent of the device size.

Figure 2:
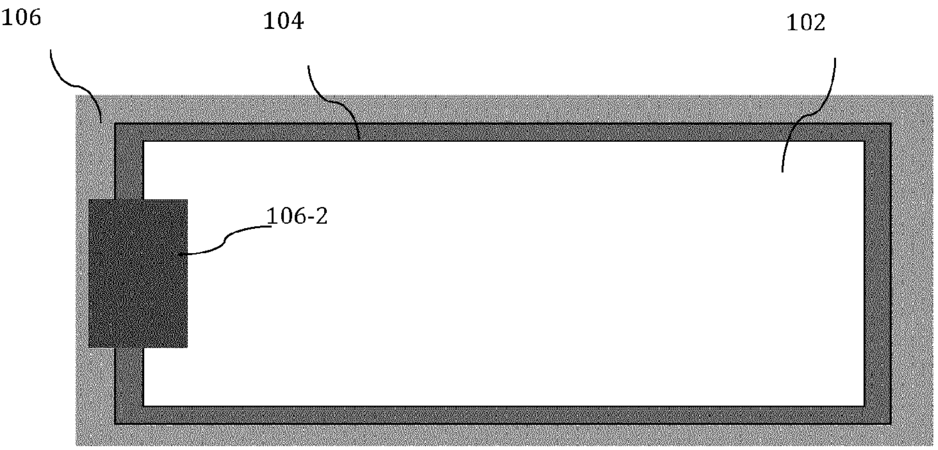
FIG. 2. shows a top view of the micro device structure.
Figure 3:
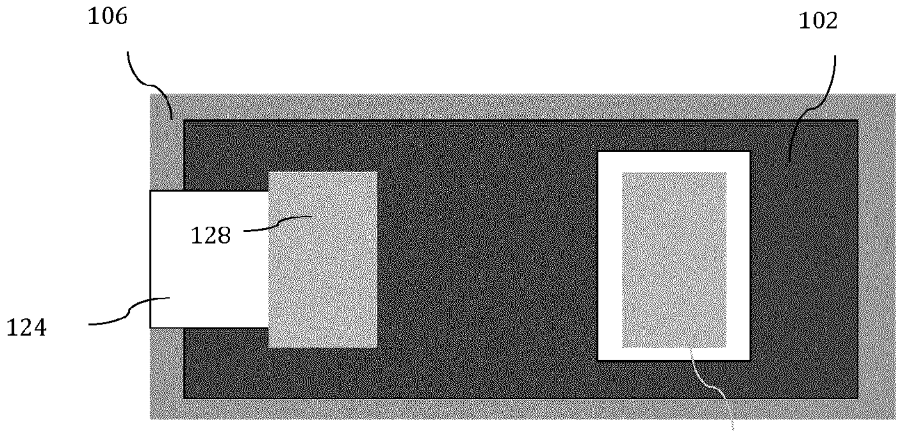
FIG. 3. shows a bottom view of the micro device structure with pads.

As shown in FIGS. 1, 2 and 3, a micro device structure 102 consists of stacked layers. The layers include active layers defining the functionality of the device, doped and blocking layers. The charges are injected into the device from the top and bottom. In one case, the contacts to the bottom and top need to be on either top or bottom. In this case, the contacts from one side need to move to the other side. The existing approach is to etch devices to create access to the doped or ohmic layer on the other side and deposit metal on the etched area and cover the doped or ohmic layer with a conductive layer. The challenge is that the etched area creates weak points in the device structure that can break under pressure. Furthermore, it reduces the device area.

In one embodiment there is a micro device structure comprising stacked layers comprising functional active, doped and blocking layers, a first conductive layer deposited on a sidewall; The device can have top side and bottom side and sidewalls. The top and bottom sides are in direction of the current in the device and sidewalls are isolation surfaces surrounding the top and bottom sides of the device. The top side is processed first and then the device is flipped and the bottom side is processed. There can be further processing on the top and bottom after forming the contacts or pads. The sidewall is covered by a dielectric layer; the first conductive layer coupling a contact from the bottom to the top surface of the micro device; and the first conductive layer coupled to the device at least through one point.

FIG. 1 shows an exemplary embodiment of connecting the top side of the device to a contact pad 128 on the bottom surface using conductive layer 106 deposited on the sidewall connected to the bottom and top contact. As shown in FIG. 1, after the bottom side of the device is separated from the substrate and the top side is fixed on a substrate, the conductive layer 106 is brought to the bottom side through another conductive layer 124. The conductive layer 124 is separated from the bottom side of the device by a dielectric layer 120. An opening or VIA 122 is formed in the dielectric 120 to provide access to the bottom side of the device. A conductive layer 126 is coupled to the bottom side through the VIA 122. Pads 128 and 130 are formed on top of the conductive layer 124 and 126. The conductive layer and pads can be the same as well.

The conductive layer 106 can be around the device. The conductive layer 124 can be around the device. There can be other dielectric layers on top of the conductive layers 106 or 124.

As shown in FIG. 2, the contact from the top or bottom is passed to the other side by depositing conductive layer 106 on the sidewall. The sidewall is covered by a dielectric layer. In one case, the top contact is coupled to the bottom side. Here the dielectric layer 104 on top of the device is opened and the conductive layer 106 is coupled to the device 102 at least through one point 106-2. The dielectric 104 opening can be smaller than the conductive point 106-2 covering the top surface. In another related case, the opening of the dielectric 104 can be larger than the conductive point 106-2.

FIG. 3, shows a bottom view of the micro device structure with pads. Here, the conductive layer 106 is connected to a pad 128 on the bottom surface where the pad 128 is separated from the bottom surface by a dielectric layer. The connection 124 can be part of the pad 128 or a separate layer. The connection 124 covers at least part of the sidewall and the bottom surface. There can be another pad 130 connected to the bottom surface through an opening 122 in the dielectric layer 120 (demonstrated in FIG. 1).

Another related embodiment is a micro device structure comprising stacked layers comprising functional active, doped and blocking layers, a first conductive layer deposited on a sidewall; the sidewall covered by a dielectric layer; the first conductive layer coupling a contact from a top to a bottom surface of the micro device; and the first conductive layer coupled to the device at least through one point.

Figure 4:
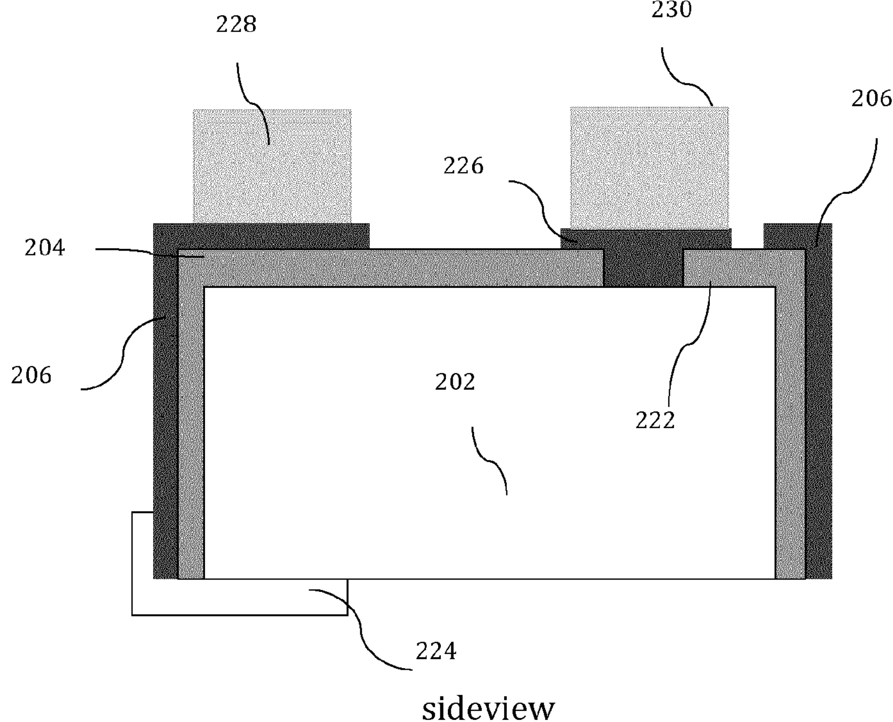
FIG. 4. shows a side view of the micro device structure with a VIA and pads.
Figure 5:
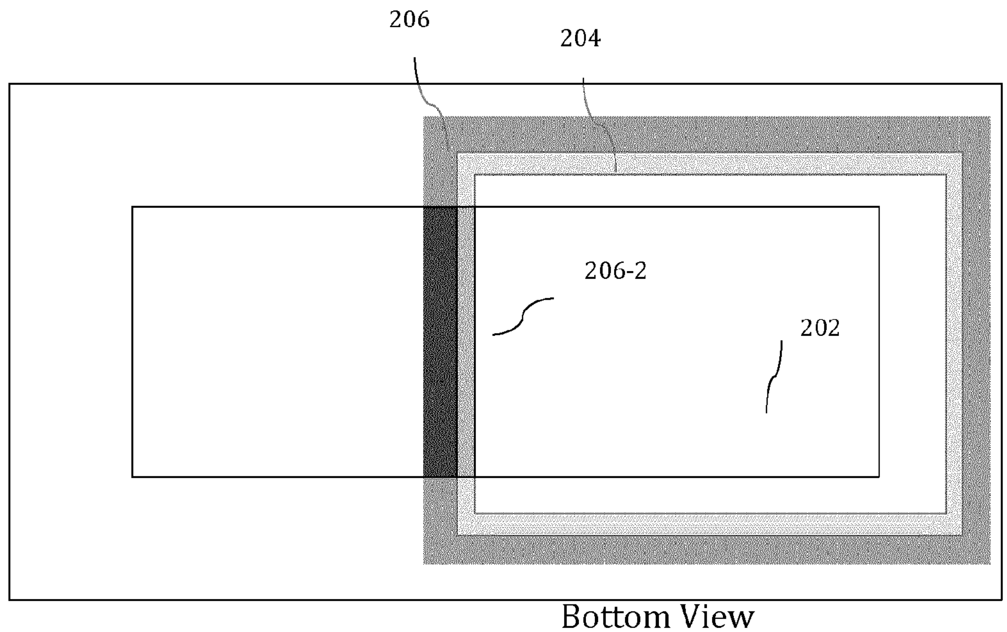
FIG. 5. shows a bottom view of the micro device structure.
Figure 6:
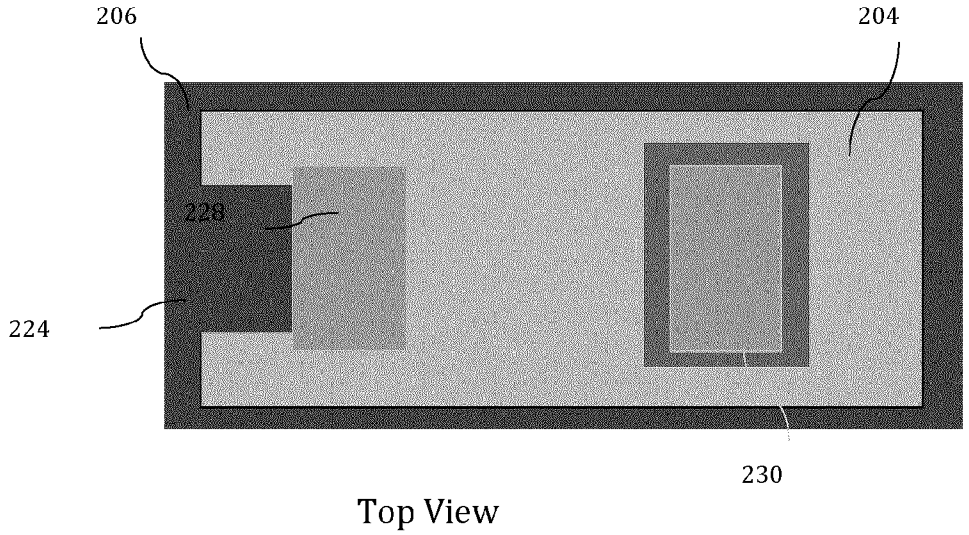
FIG. 6. shows a top view of the micro device structure with pads.

FIG. 4 shows an exemplary embodiment of connecting the bottom side of the device to a contact pad 128 on the top surface using conductive layer 106 deposited on the sidewall connected to the bottom and top contact. As shown in FIGS. 4, 5 and 6 a micro device structure 202 consists of stacked layers. The layers include active layers defining the functionality of the device, doped and blocking layers. The charges are injected into the device from the top and bottom. In one case, the contacts to the bottom and top need to be on either top or bottom. In this case, the contacts from one side need to move to the other side. The existing approach is to etch devices to create access to the doped or ohmic layer on the other side and deposit metal on the etched area and cover the doped or ohmic layer with a conductive layer. The challenge is that the etched area creates weak points in the device structure that can break under pressure. Furthermore, it reduces the device area. Here the conductive metal 206 is formed on the sidewall and part of the top side. A pad 228 is formed on the top side of the device where it is connected to the conductive layer 106 and the pad is separated from the device 202 by a dielectric layer 204. The dielectric layer 204 covers the sidewalls as well. The pad 228 or conductive layer 206 can be the same or share some layers. Another pad can be formed on the top surface where it is connected to the top of the device through an opening 222 in the dielectric layer 204. Another conductive layer 226 can form as part of the pad 230 or is the same as the pad 230. The conductive layer 226 can form at the same time as layer 206. The conductive layer 206 is connected to the bottom surface of the device 202 through a second conductive layer 224.

As shown in FIG. 4, pads 228 and 230 are formed on part of the conductive layers 206 and 226. The conductive layer and pads can be the same as well.

FIG. 5 shows a bottom view of the micro device structure. Here, the conductive layer 206 is around the device 202. A second conductive layer 224 is connecting the first conductive layer 206 to the bottom surface of the device 202. The bottom surface can have a dielectric layer and the layer 224 is connected to the bottom surface through an opening in the dielectric layer.

As shown in FIG. 6, the contact from the top or bottom is passed to the other side by depositing conductive layer 206 on the sidewall. The sidewall is covered by a dielectric layer. In one case, the bottom contact is coupled to the top side. Here the dielectric layer 204 on top of the device is opened and the conductive layer 226 coupled to the device 202 at least through one point 206-2. As shown in FIG. 6, The conductive layer 206 is deposited on at least part of the sidewall and extended over the dielectric layer 204 at least in one area.

As shown in FIG. 6, after the bottom side of the device is separated from the substrate and the top side is fixed on a substrate, the conductive layer 206 is brought to the bottom side through another conductive layer 224. The conductive layer 224 is coupled to the bottom side of the device.

The conductive layer 206 can be around the device. The conductive layer 224 can also be around the device. There can be other dielectric layers on top of the conductive layers 206 or 224.

METHOD EMBODIMENT

The invention disclose a method to pass a signal through a side wall of a micro device, the method comprising:having stacked layers comprising functional active, doped and blocking layers, depositing a first conductive layer on the sidewall, covering the sidewall covered by a dielectric layer, coupling a contact from a top to a bottom of the micro device though the first conductive layer, coupling the first conductive layer to the micro device at least through one point, and injecting the signal though the top and bottom of the micro device.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A micro device structure comprising:

a micro device comprising:

stacked layers comprising functional active, doped and blocking layers;

a sidewall of the micro device directly covered with a first dielectric layer;

a first conductive layer directly covering the first dielectric layer on the sidewall;

the first conductive layer directly overlying a top surface of the micro device thereby electrically coupling the first conductive layer to the top surface of the micro device;

a second conductive layer overlying a bottom surface of the micro device and electrically coupling the first conductive layer, thereby electrically coupling the top surface and the bottom surface of the micro device; and a second dielectric layer directly overlying the bottom surface of the micro device and having a VIA for accessing the bottom surface of the micro device.

2. The micro device structure of claim 1, wherein the second conductive layer is separated from the bottom surface of the micro device by the second dielectric layer.

3. The micro device structure of claim 2, wherein the first and second conductive layers go around the micro device.

4. The micro device structure of claim 3, wherein other dielectric layers are disposed on top of the first and second conductive layers.

5. The micro device structure of claim 1, wherein a third conductive layer is coupled to the bottom surface of the micro device through the VIA.

6. The micro device structure of claim 5, wherein the third conductive layer is in part separated from the bottom surface of the micro device by the second dielectric layer.

7. The micro device structure of claim 5 further comprising, pads coupled to each of the second and third conductive layers.

8. The micro device structure of claim 1, wherein the first conductive layer covers at least part of the sidewall and is extended over the first dielectric layer at least in one area.

9. The micro device structure of claim 8, comprising pads on top of the first conductive layer and a fourth conductive layer.

10. The micro device structure of claim 9, wherein at least one of the first conductive layer and the fourth conductive layer and a pad are the same.

11. The micro device structure of claim 9, wherein the first conductive layer is connected to the bottom surface of the micro device through a fifth conductive layer which is coupled to the bottom surface of the micro device.

12. The micro device structure of claim 11, wherein other dielectric layers cover the first and fifth conductive layers.

13. A method to pass a signal through a side wall of a micro device structure, the method comprising:

providing a micro device having stacked layers comprising functional active, doped and blocking layers;

directly covering a sidewall of the micro device by with a first dielectric layer;

directly covering the first dielectric layer on the sidewall with a first conductive layer;

extending the first conductive layer to directly overlie a top surface of the microdevice thereby electrically coupling the first conductive layer to the top surface of the micro device;

overlying a bottom surface of the micro device with a second conductive layer;

electrically coupling the second conductive layer to the first conductive layer thereby electrically coupling the top surface and the bottom surface of the micro device; and injecting the signal though the top surface and the bottom surface of the micro device, wherein a second dielectric layer directly overlying on the bottom surface of the micro device has a VIA for accessing the bottom surface of the micro device.

14. The method of claim 13, wherein the second conductive layer is separated from the bottom surface of the micro device by the second dielectric layer.

15. The method of claim 14, wherein the first and second conductive layers go around the micro device.

16. The method of claim 15, wherein other dielectric layers are disposed on top of the first and second conductive layers.

17. The method of claim 13, wherein a third conductive layer is coupled to the bottom surface of the micro device through the VIA.

18. The method of claim 17, wherein the third conductive layer is in part separated from the bottom surface of the micro device by the second dielectric layer.

19. The method of claim 17, wherein the micro device structure further includes pads coupled to each of the second and third conductive layers.

20. The method of claim 13, wherein the first conductive layer covers at least part of the sidewall and is extended over the first dielectric layer at least in one area.

21. The method of claim 20, wherein the micro device structure further includes pads on top of the first conductive layer and a fourth conductive layer.

22. The micro device structure of claim 21, wherein at least one of the first conductive layer and the fourth the conductive layer and a pad are the same.

23. The micro device structure of claim 21, wherein the first conductive layer is connected to the bottom surface of the micro device through a fifth conductive layer which is coupled to the bottom surface of the micro device.

24. The micro device structure of claim 23, wherein other dielectric layers cover the first and fifth conductive layers.

* * * * *